United States Patent
Choi et al.

(10) Patent No.: US 7,590,394 B2
(45) Date of Patent: Sep. 15, 2009

(54) APPARATUS AND METHOD FOR AMPLIFYING MULTI-MODE POWER USING PRE-DISTORTER

(75) Inventors: Yong-Sun Choi, Soongnam-si (KR); Hyun-Su Yoon, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 582 days.

(21) Appl. No.: 11/500,255

(22) Filed: Aug. 7, 2006

(65) Prior Publication Data

US 2007/0032208 A1 Feb. 8, 2007

(30) Foreign Application Priority Data

Aug. 6, 2005  (KR) .................. 10-2005-0072037

(51) Int. Cl.
*H04B 1/04* (2006.01)

(52) U.S. Cl. ............... 455/114.3; 455/127.1; 455/127.3

(58) Field of Classification Search ............... 455/114.3, 455/127.1, 127.3, 127.2, 552.1, 293, 115.1, 455/119, 126, 127.4, 194.2, 253.2, 341
See application file for complete search history.

(56) References Cited

U.S. PATENT DOCUMENTS 6,489,843 B1 * 12/2002 Nishijima et al. ............. 330/51
7,313,416 B1 * 12/2007 Harmon et al. ........... 455/562.1
2006/0084469 A1 * 4/2006 Malone et al. ............ 455/552.1
2007/0032208 A1 * 2/2007 Choi et al. ................ 455/114.3
2008/0030276 A1 * 2/2008 Hau et al. .................... 330/279
2008/0057883 A1 * 3/2008 Pan ........................... 455/127.1

\* cited by examiner

*Primary Examiner*—Pablo N Tran
(74) *Attorney, Agent, or Firm*—The Farrell Law Firm, LLP (57) ABSTRACT

A method and an apparatus for amplifying power in a communication system is disclosed that includes a detection module which detects a power level of a predetermined signal selected from among an input signal and an output signal of a power amplifier and then transmits an operation mode control signal for the power amplifier; a gate bias controller which controls a gate bias of the power amplifier in accordance with the detected power level; and a power amplifier which operates as class B or class A in accordance with control by the gate bias controller to generate a pre-distortion component, offsets a distortion component generated during amplification of the predetermined signal by synthesizing the pre-distortion component with the distortion component, and outputs only the predetermined signal without a distortion component.

13 Claims, 6 Drawing Sheets

APPARATUS AND METHOD FOR AMPLIFYING MULTI-MODE POWER USING PRE-DISTORTER

PRIORITY

This application claims the benefit under 35 U.S.C. § 119 (a) of an application filed in the Korean Industrial Property Office on Aug. 6, 2005 and assigned Serial No. 2005-72037, the contents of which are incorporated herein by reference.

BACKGROUND OF THE INVENTION

1. Field of the Invention

The present invention relates to a communication system, and more particularly to an apparatus for amplifying multi-mode supporting power and a method for the same, which can operate as both a single carrier power amplifier and a multi-carrier power amplifier by improving linearity of an output signal in a communication system.

2. Description of the Related Art

In a communication system, power amplifiers are disposed at final output parts of Base Stations (BSs) and Mobile Stations (MSs), so as to amplify an input signal of a low level, for example, a base band signal, to an output signal of a high level, for example, a Radio Frequency (RF) band signal.

The RF signal having an amplitude modulated by a power amplifier usually has a distorted signal component due to non-linearity of the power amplifier. Such non-linearity of the power amplifier generates other frequency components in addition to the input frequency component that influence adjacent channels. That is to say, the gain reduction by the input signal and the channel interference due to inter-modulation degrade the capacity of the entire system. Therefore, linearity of the power amplifier is a very important parameter in the power amplifier.

Specifically, non-linear distortion of the power amplifier may cause interference between signals of reception bands or between channels. Therefore, there has been a requirement for a power amplifier having little distortion. There has been a method of increasing the quantity of current used by amplifier elements in order to reduce the distortion. However, according to this method, the quantity of used current may become too large in a high output power system. Therefore, various methods for reducing the distortion elements through application of distortion compensation circuits have been put to practical use.

For example, various schemes including a feedforward scheme, a feedback scheme, a pre-distortion scheme, etc. may be used in order to increase linearity of the power amplifier. According to the feedforward scheme, only non-linear components are detected from an output of a non-linear power amplifier and are then offset in an output signal. According to the feedback scheme, distortion or components causing the distortion are extracted at an output side and are then compensated for at an input side.

A power amplifier using the pre-distortion scheme in order to increase linearity of the power amplifier has a simpler structure than that of the feedforward scheme, because it does not require a separate amplifier for a distortion elimination loop. Therefore, a power amplifier using the pre-distortion scheme can be manufactured to have a small volume and has a high efficiency because it consumes less additional Direct Current (DC) power. Further, the power amplifier using the pre-distortion scheme can be manufactured at less manufacturing cost than the power amplifier using the feedforward scheme. In addition, the power amplifier using the pre-distortion scheme has an open loop structure and thus has less limitation in using the frequency bands than the power amplifier using the feedback scheme.

Therefore, typical communication systems usually use the pre-distortion scheme which allows for lower manufacturing costs and has less limitations in using the frequency bands due to the open loop structure than the feedback scheme.

The pre-distortion linearization scheme as described above refers to a scheme in which a pre-distortion circuit at a front end performs pre-distortion of a signal in order to achieve a characteristic opposite to the transfer function characteristic of a non-linear power amplifier, thereby linearizing the final output. There are various types of pre-distortion linearizers, which can be generally classified into analog linearizers and digital linearizers.

According to the digital linearization scheme, an amplitude and a phase of an input signal of a low level (for example, a baseband signal) are subjected to digital signal processing in a modem before modulation into an output signal of a higher level, for example, Intermediate Frequency (IF) or Radio Frequency (RF) modulation. Specifically, according to the digital linearization scheme, the amplitude and the phase of the input signal are pre-distorted by using an inverse function of a complex gain transfer function of a power amplifier. According to the digital linearization scheme, adaptive signal processing is easier than with other schemes because it uses a digital technology. However, according to the digital linearization scheme, a demodulation process for detection of an error signal is necessary, and it is difficult to compensate for change in a plurality of carriers at the final output part.

According to the analog linearization scheme, an input signal of a non-linear power amplifier is pre-distorted at an IF part or RF part, so as to implement the linearization. The analog linearization scheme is employed by various types of pre-distorters, such as a Bipolar Junction Transistor (BJT), a Laterally Diffused Metal Oxide Semiconductor (LDMOS) transistor, and a Gallium Arsenic (GaAs) Field Effect Transistor (GaAs FET), which can be selectively used to satisfy a specific purpose.

From among the various types of analog pre-distorters described above, an analog pre-distorter using the GaAs FET will be described hereinafter.

The analog pre-distorter using the GaAs FET generates an Inter-Modulation Distortion (IMD) component at a drive stage, which has the same amplitude as that of the IMD component at a main stage and an opposite phase to that of the IMD component at the main stage. By the generated IMD component, it is possible to eliminate the IMD component of the signal having passed through the main stage, to increase linearity of the power amplifier.

In a power amplifier including the pre-distorter described above, the LDMOS transistor employed in most power amplifiers is used at the main stage, while the GaAs FET, which can easily control change in the characteristic of the transistor by controlling the gate bias, is mainly used at the drive stage.

However, when the pre-distorter uses the GaAs FET, the IMD characteristic of the GaAs FET is usually set in accordance with the IMD characteristic of the main stage. Therefore, when input of the power amplifier changes, the operation area of the power amplifier changes, thereby changing the IMD characteristic of the main stage and degrading the performance of the pre-distorter. For example, when the input power is increased, the power amplifier operates in a non-linear area, thereby degrading the IMD characteristic. In contrast, when the input power is decreased, the IMD characteristic is improved.

Meanwhile, the power amplifier as described above can be classified according to the bandwidth of the input signal into a Single Carrier Power Amplifier (SCPA), which uses a single carrier, and a Multi-Carrier Power Amplifier (MCPA), which uses a multi-carrier. The SCPA amplifies the single carrier, that is, a 1FA signal. Therefore, the SCPA does not require linearization in order to secure linearity. The MCPA amplifies a multi-carrier, that is, 3FA signal or 8FA to 15FA signals Therefore, the MCPA requires linearization in order to eliminate inter-modulation components of a wideband.

Recent communication systems employ technologies for increasing transmission speed and capacity through beam forming, diversity, etc. by applying a multiple antenna system, for example, a smart antenna system. Because the multiple antenna technology uses a plurality of antennas, it requires the same output power for the entire power amplifier but requires a reduced output power for operation of each antenna in the power amplifier.

Meanwhile, due to its characteristics as described above, it is difficult to apply the analog pre-distorter using the GaAs FET to a power amplifier which can generate and output both a single carrier signal of a high output power and a multi-carrier signal of a low output power.

That is, if there were a single power amplifier which can generate and output both a single carrier signal of a high output power and a multi-carrier signal of a low output power, the single power amplifier can operate as an SCPA for amplifying only a single carrier at normal times and operate as an MCPA when it is applied to a multiple antenna system such as a smart antenna system. However, the conventional systems have failed to provide such a power amplifier due to the characteristics of the analog pre-distorter using the GaAs FET.

SUMMARY OF THE INVENTION

Accordingly, the present invention has been made to solve the above-mentioned problems occurring in conventional systems, and an object of the present invention is to provide a multi-mode supporting power amplifier which can improve linearity and can perform both an SCPA operation and MCPA operation with high efficiency.

It is another object of the present invention to provide a solution which can implement a multi-mode supporting power amplifier using an analog pre-distorter.

It is still another object of the present invention to provide a multi-mode supporting power amplifier using an analog pre-distorter, which can be applied to both a single carrier signal and a multi-carrier signal.

In order to accomplish this object, there is provided a method for amplifying power in a communication system, which includes the steps of: detecting a power level of a predetermined signal from among a predetermined input signal and a predetermined output signal; adaptively changing a gate bias in accordance with the detected power level; generating a pre-distortion component through operation of a single carrier mode or a multi-carrier mode in accordance with the changed gate bias; and outputting only the predetermined signal after offsetting a distortion component generated during amplification of the predetermined signal by synthesizing the pre-distortion component with the distortion component.

In accordance with another aspect of the present invention, there is provided an apparatus for amplifying power in a communication system, which includes: a detection module which detects a power level of a predetermined signal from among an input signal and an output signal of a power amplifier and then transmits an operation mode control signal for the power amplifier; a gate bias controller which controls a gate bias of the power amplifier in accordance with the detected power level; and a power amplifier which operates in class A or B regions in accordance with control by the gate bias controller to generate a pre-distortion component, offsets a distortion component generated during amplification of the predetermined signal by synthesizing the pre-distortion component with the distortion component, and outputs only the predetermined signal without distortion component.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. In the following description, a detailed description of known functions and configurations incorporated herein will be omitted when it may make the subject matter of the present invention rather unclear.

The present invention proposes a multi-mode power amplifier which can operate as both an SCPA using a single carrier and an MCPA using a multi-carrier.

The present invention proposes a power amplifier which can operate either in a single carrier mode or in a multi-carrier mode for power amplification in a communication system. To this end, the power amplifier of the present invention includes a pre-processor provided at a front end of the power amplifier, so that the operation range of the pre-processor can be controlled according to a selected mode.

The present invention discloses a Single Multi Carrier Power Amplifier (SMCPA) using a pre-distorter, which can operate as both an SCPA and an MCPA. In the SMCPA according to the present invention, the pre-distorter is optimized for the input power range to adaptively secure linearity and to support both a lower power multi frequency band (multi FA) and a high power single frequency band (single FA).

In a power amplifier according to the present invention as described above, it is possible to simultaneously deal with both a single carrier signal and a multi-carrier signal by controlling a gate bias of a transistor in a pre-distorter. That is, the present invention proposes a pre-distorter which can support both an SCPA using a single carrier and an MCPA using a multi-carrier, so that a single power amplifier having the pre-distorter can amplify both a single carrier signal and a multi-carrier signal.

In a pre-distorter proposed by the present invention, a drive stage of the power amplifier can generate Inter-Modulation Distortion (IMD) components, which have the same amplitude as that of the IMD components at a main stage of the amplifier and an opposite phase (inverse phase) to that of the IMD component at the main stage. By the inverse phase IMD components, it is possible to eliminate IMD components of the signal having passed through the main stage, thereby increasing linearity of the power amplifier.

In contrast, in a typical power amplifier, the main stage employs a Laterally Diffused Metal Oxide Semiconductor (LDMOS) transistor, which is used for most power amplifiers, and the drive stage employs a Gallium Arsenic (GaAs) Field Effect Transistor (GaAs FET) having a characteristic which can be easily changed through control of a gate bias.

Hereinafter, structures of a typical power amplification system, which does not use a pre-distorter, and a typical power amplification system, which uses a pre-distorter, will be described with reference to FIGS. 1 and 2.

Figure 1:
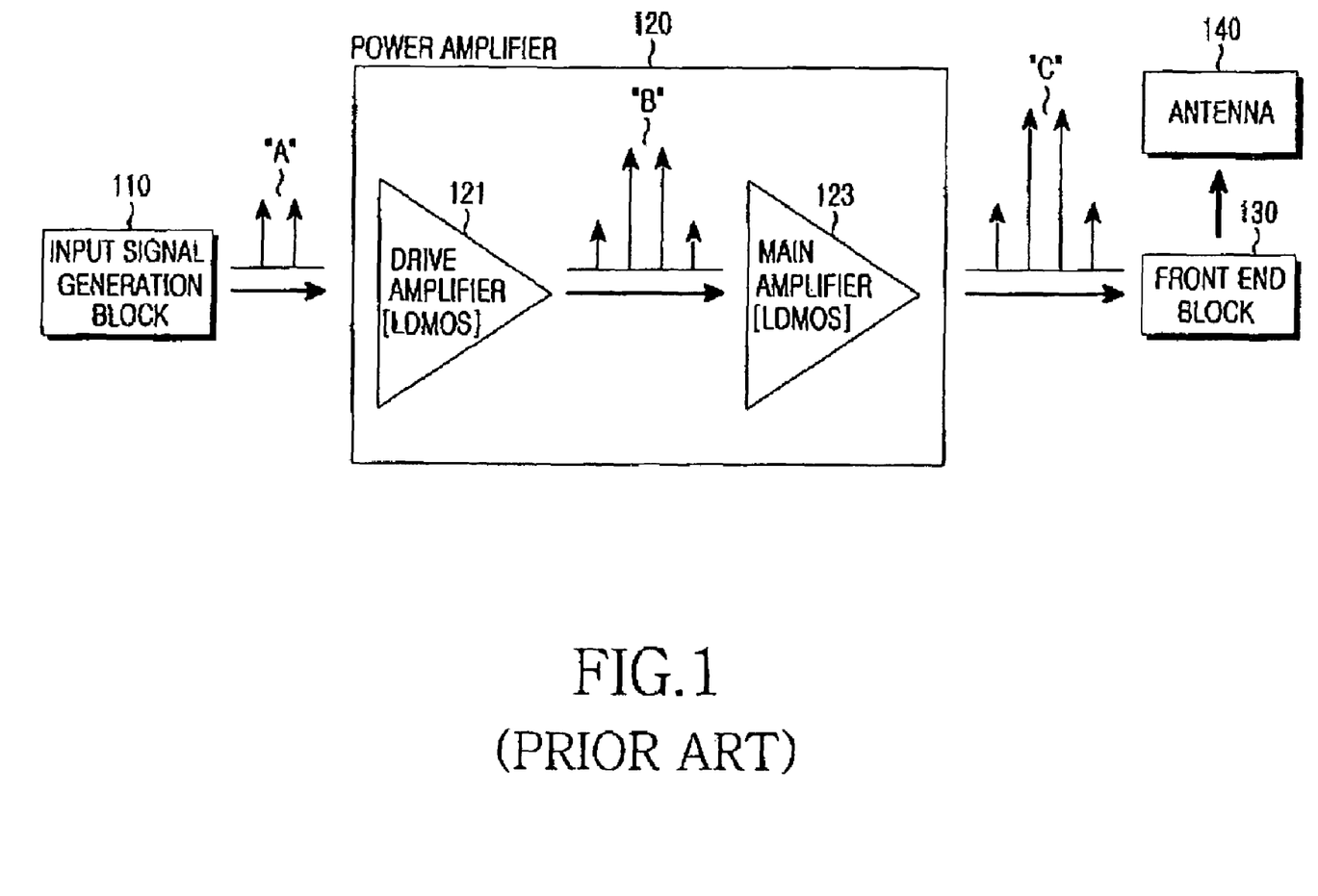
FIG. 1 is a block diagram illustrating a structure of a system equipped with a typical power amplifier which does not use a pre-distorter.

FIG. 1 is a block diagram illustrating a structure of a system equipped with a typical power amplifier which does not use a pre-distorter.

Referring to FIG. 1, the power amplification system includes an input signal generation block 110, a power amplifier 120, a front end block 130, and an antenna 140. The power amplifier 120 includes a drive amplifier 121 and a main amplifier 123. The drive amplifier 121 and the main amplifier 123 are implemented by using LDMOS transistors.

It is noted from FIG. 1 that non-linearity of the amplifier causes Inter-Modulation Distortion (IMD) during the amplification without a pre-distorter. That is, the input signal generation block 110 generates two different frequency signals, which include input frequency signals as designated by reference symbol "A," and then outputs the generated signals to the power amplifier 120.

Then, the signals A input to the power amplifier 120 are transferred to the drive amplifier 121. The drive amplifier 121 amplifies the input signals A and then outputs the amplified signals. At this time, the signals output ("B") from the drive amplifier 121 include added distortion. That is, the output signals B include distortion components added to the input signals A.

The main amplifier 123 amplifies the signals B containing the distortion components from the drive amplifier 121 and then outputs signals designated by reference symbol "C." Finally, the output signals C are transmitted over the air through the front end block 130 and the antenna 140.

As described above, in the case of the typical power amplifier which does not use a pre-distorter, IMD components are generated during the amplification of the input signals due to non-linearity of the power amplifier, thereby degrading the performance of the system. That is, the distortion components generated by the drive amplifier are amplified and then output together with the input main signals by the main amplifier. Therefore, the distortion components degrade the performance of the system.

Figure 2:
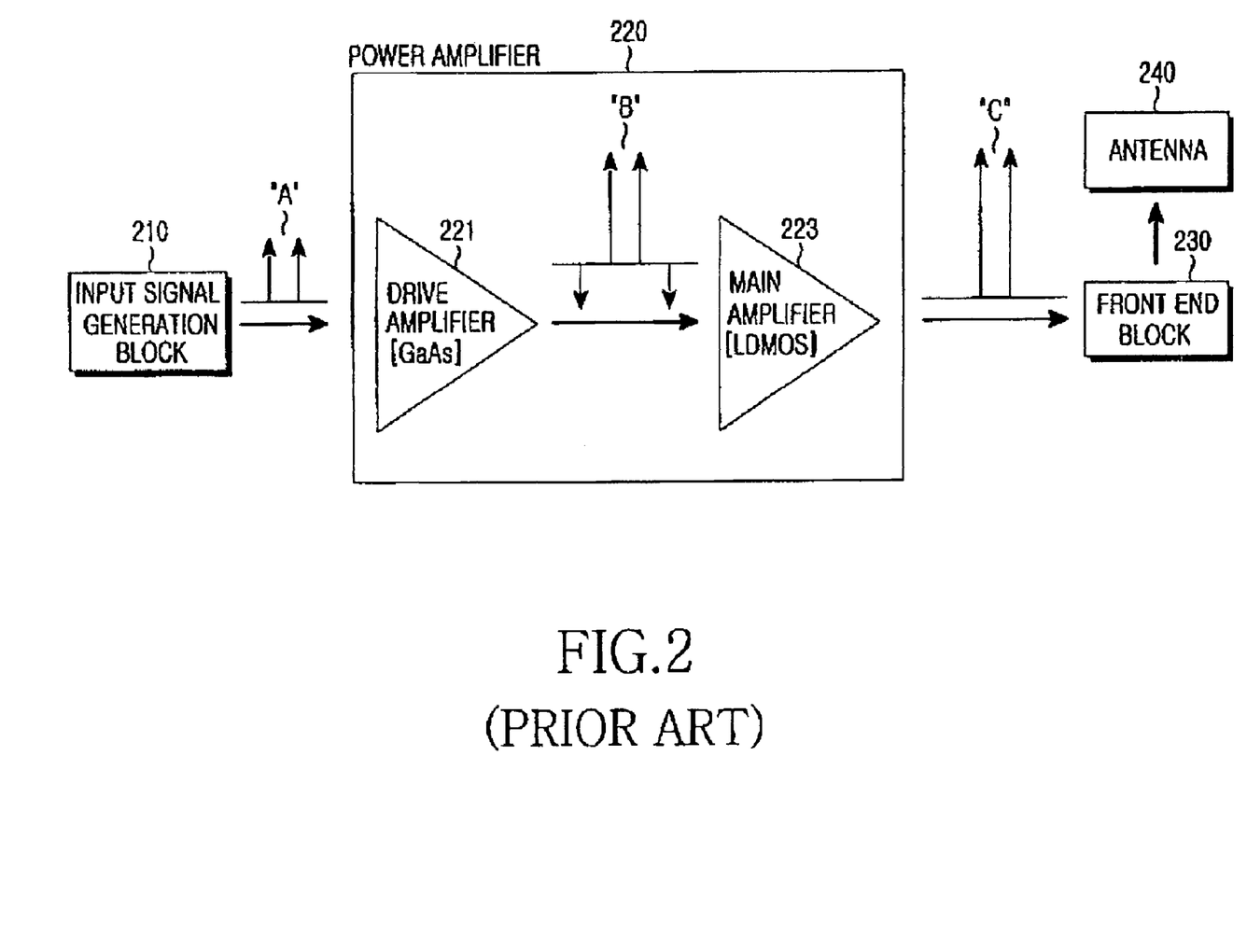
FIG. 2 is a block diagram illustrating a structure of a system equipped with a typical power amplifier which uses a pre-distorter.

FIG. 2 is a block diagram illustrating a structure of a system equipped with a typical power amplifier which uses a pre-distorter.

Referring to FIG. 2, the power amplification system using a pre-distorter includes an input signal generation block 210, a power amplifier 220, a front end block 230, and an antenna 240. The power amplifier 220 includes a drive amplifier 221 and a main amplifier 223. The drive amplifier 221 is constructed by using a GaAs FET, and the main amplifier 223 is constructed by using an LDMOS transistor.

As noted from FIG. 2, the power amplification system shown in FIG. 2 uses a pre-distorter in order to eliminate the IMD component of FIG. 1. Specifically, in the case of the pre-distorter using the GaAs FET, the GaAs FET at a drive stage, that is, the GaAs FET of the drive amplifier 221, generates an IMD component, which has the same amplitude as that of the IMD component at a main stage (that is, the main amplifier 223) and an opposite phase (inverse phase) to that of the IMD component at the main stage. In the signal having passed the main amplifier 223, the IMD component is offset by the generated IMD component with an inverse phase and is thus eliminated.

The input signal generation block 210 generates two different frequency signals, that is, input frequency signals as designated by reference symbol "A," and then outputs the generated signals to the power amplifier 220. Then, the signals A input to the power amplifier 220 are transferred to the drive amplifier 221. The drive amplifier 221 amplifies the input signals A and then outputs the amplified signals.

At this time, the drive amplifier 221 generates IMD components and inserts the generated components into the signals output to the main amplifier 223 as designated by symbol "B." That is, the signals output from the drive amplifier 221 include generated IMD components which have the same amplitude as that of the IMD components of the main amplifier 223 and an opposite phase (inverse phase) to that of the IMD components of the main amplifier 223. The output signals B include IMD components with an inverse phase added to the input signals A.

Then, the main amplifier 223 amplifies the signals B containing the inverse phase IMD components from the drive amplifier 221 and then outputs signals ("C") without the IMD components. That is, the main amplifier 223 offsets the inverse phase IMD components generated by the drive amplifier 221 and then outputs the signals C from which the IMD components have been eliminated. Finally, the output signals C are transmitted over the air through the front end block 230 and the antenna 240.

As described above, in the typical power amplifier which includes a pre-distorter using the GaAs FET, IMD components, which have the same amplitude as that of the IMD components of a main stage of the power amplifier and an opposite phase (inverse phase) to that of the IMD components of the main stage, are generated by the GaAs FET at the drive stage, so that the IMD components are eliminated from the signals having passed through the main stage.

As a result, only the main signals are output at the final output stage, because the distortion of the main signals has been compensated, that is, the distortion components at the main amplifier 223 have been synthesized and offset by inverse phase components. It is an important condition that such systems exactly control the phase and power level.

However, in order to implement such functions as described above, it is necessary to control the characteristic of the GaAs FET to correspond to the characteristic of the main amplifier 223. When the power of an input signal changes and the characteristic of the main amplifier 223 will change, and the performance of the analog pre-distorter using the GaAs FET is degraded. For example, when the power of the input signal is increased, the power amplifier operates in a non-linear area, thereby degrading the IMD characteristic. Therefore, it is necessary to increase the distortion components generated by the pre-distorter in consideration of such degradation of the IMD characteristic. In contrast, when the power of the input signal decreases, it is necessary to also decrease the distortion components generated by the pre-distorter.

In order to solve the above-mentioned problems, the present invention proposes a solution, in which an input signal or an output signal is detected, a GaAs FET of a drive stage is operated in a class B region to increase the pre-distortion components by controlling the gate bias of the GaAs FET when the detected signal includes a single carrier with a high power, and the GaAs FET of the drive stage is operated in a class A region for linear operation to decrease or eliminate the pre-distortion components when the detected signal includes a multi-carrier with low power.

Therefore, the present invention proposes a pre-distorter using a GaAs FET applicable to a power amplifier, which includes a detection block for detecting power of a predetermined signal, i.e. at an input stage or output stage of the power amplifier, and a control block for controlling gate bias of the GaAs FET by use of the value detected by the detection block, so that the pre-distorter can be applied to both a single carrier signal and a multi-carrier signal.

That is, a power amplification system proposed by the present invention includes a detection block for detecting a predetermined input signal or output signal, a control block for controlling gate bias by use of a result of the detection, and a power amplifier including a drive stage using a GaAs FET and a main stage using an LDMOS transistor.

Hereinafter, the power amplification system according to the present invention will be described in more detail with reference to the attached drawings.

Figure 3A:
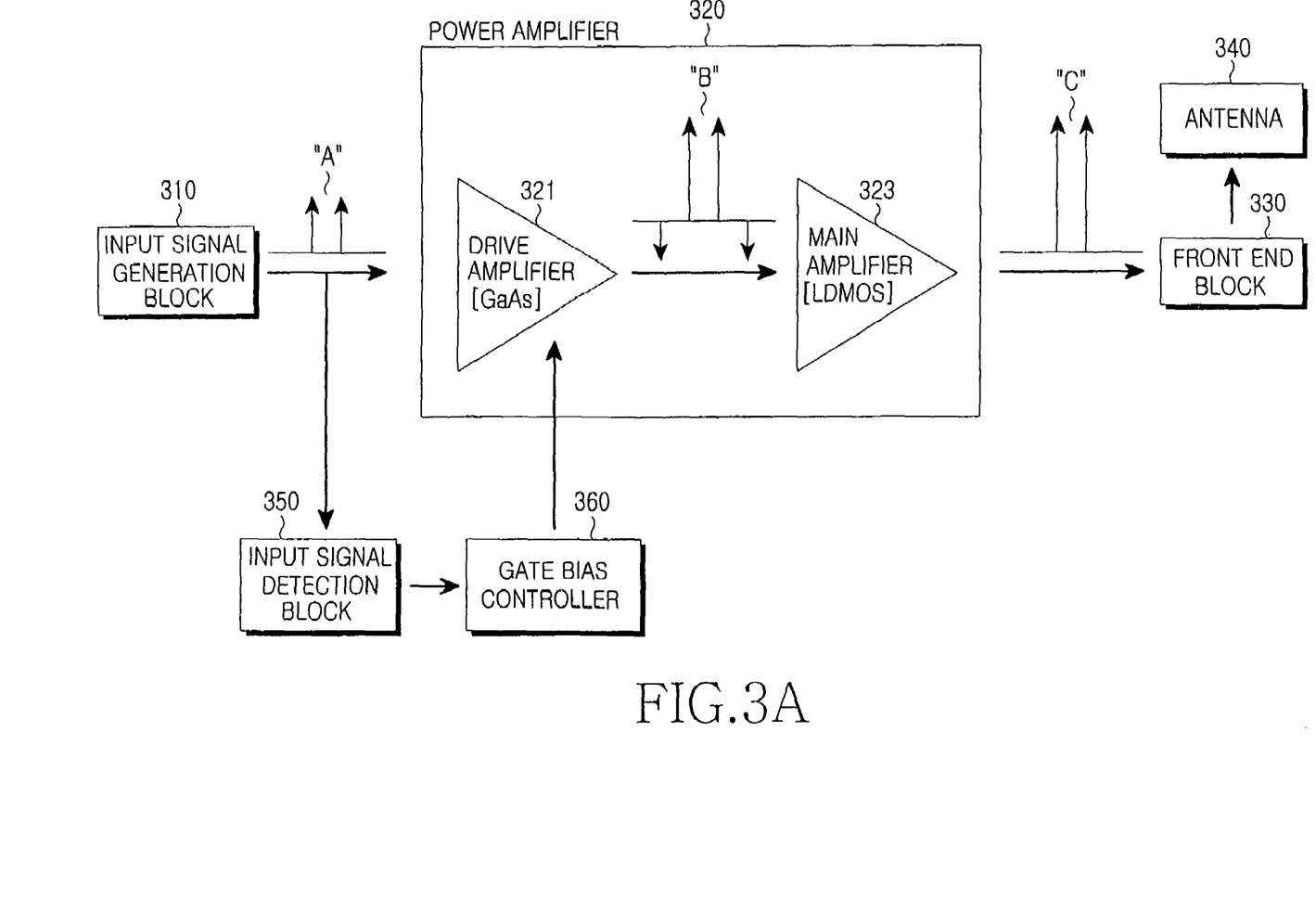
FIGS. 3A and 3B are block diagrams that illustrate an embodiment of a structure of a power amplifier using an analog pre-distorter.
Figure 3B:
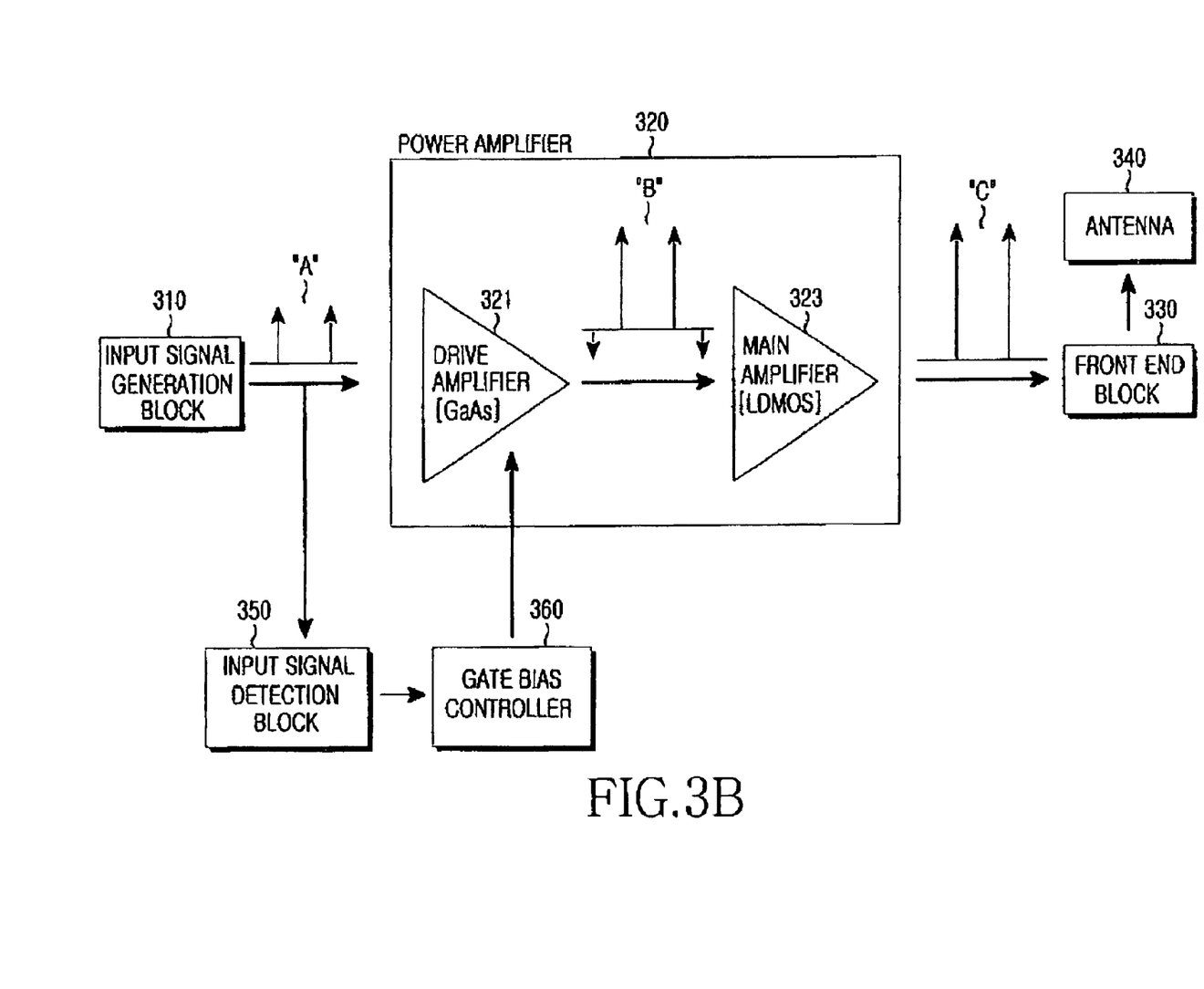

FIGS. 3A and 3B are block diagrams illustrating a power amplification system using an analog pre-distorter according to an embodiment of the present invention, which operates as an SCPA or MCPA according to an input signal. Specifically, FIG. 3A illustrates distortion components when the power amplifier operates as an SCPA in a system using a single antenna, and FIG. 3B illustrates distortion components when the power amplifier operates as an MCPA in a system using a smart antenna.

Referring to FIGS. 3A and 3B, a power amplification system according to an embodiment of the present invention includes an input signal generation block 310, a power amplifier 320, a front end block 330, an antenna 340, an input signal detection block 350, and a gate bias controller 360. The power amplifier 320 includes a drive amplifier 321 using a GaAs FET and a main amplifier 323 using an LDMOS transistor.

The power amplifier 320 shown in FIGS. 3A and 3B uses a GaAs FET pre-distorter which operates as an SCPA or MCPA. In the GaAs FET pre-distorter, a GaAs FET of drive amplifier 321 generates IMD components, which have the same amplitude as that of the IMD components at a main stage (that is, the main amplifier 323) and an opposite phase (inverse phase) to that of the IMD components at the main stage, thereby eliminating the IMD components in the signal having passed through the main amplifier 323. As a result, only the main signals are output at the final output stage, because the distortion of the main signals has been compensated, that is, the distortion components at the main amplifier 323 have been synthesized and offset by inverse phase components.

The input signal generation block 310 generates two different frequency signals, that is, input frequency signals as designated by reference symbol "A," and then outputs the generated signals to the power amplifier 320. Then, the input signal detection block 350, i.e. detection module, detects the signals A generated by and output from the input signal generation block 310. Specifically, the input signal detection block 350 detects the power level of the input signals A and transfers the detected value to the gate bias controller 360. Then, the gate bias controller 360 controls the gate bias of the GaAs FET within the drive amplifier 321 by use of the value detected by the input signal detection block 350.

Specifically, the gate bias controller 360 controls the gate bias of the GaAs FET in accordance with the input power level detected by the input signal detection block 350. When the detected input power level exceeds a predetermined threshold, the input signal detection block 350 determines that the input signal includes a single carrier. In contrast, when the detected input power level does not exceed a predetermined threshold, the input signal detection block 350 determines that the input signal includes a multi-carrier. For another example, the input signal detection block 350 may receive carrier information from the system and use the information in the determination. When the detected input power level exceeds the predetermined threshold and the input signal includes a single carrier, the gate bias of the GaAs FET is controlled to operate in the class B region, thereby increasing the pre-distortion components, as shown in FIG. 3A. Further, when the detected input power level does not exceed the predetermined threshold and the input signal includes a multi-carrier, the gate bias of the GaAs FET is controlled to operate in the class A region, thereby eliminating the pre-distortion components, as shown in FIG. 3B.

In the class A region in which bias is set to be high, a good linearity is secured while a low efficiency is obtained (theoretically maximum 50%). In the class B region in which bias is set to approach zero, a high efficiency (theoretically maximum 75%) is secured while a very bad linearity is obtained. Further, in a class C region in which bias is applied in an inverse direction, a high efficiency (theoretically maximum 100%) is secured while the obtained linearity is worse than that of the class B region because the class C region has severe distortion. In other words, according to the shift from the class A region toward the class C region, linearity gets worse and efficiency gets improves.

In brief, it is possible to adaptively control the amplitude of pre-distortion components by controlling the drive stage, that is, the operation of the drive amplifier, in accordance with the detected power level of the input signal as described above.

Figure 4A:
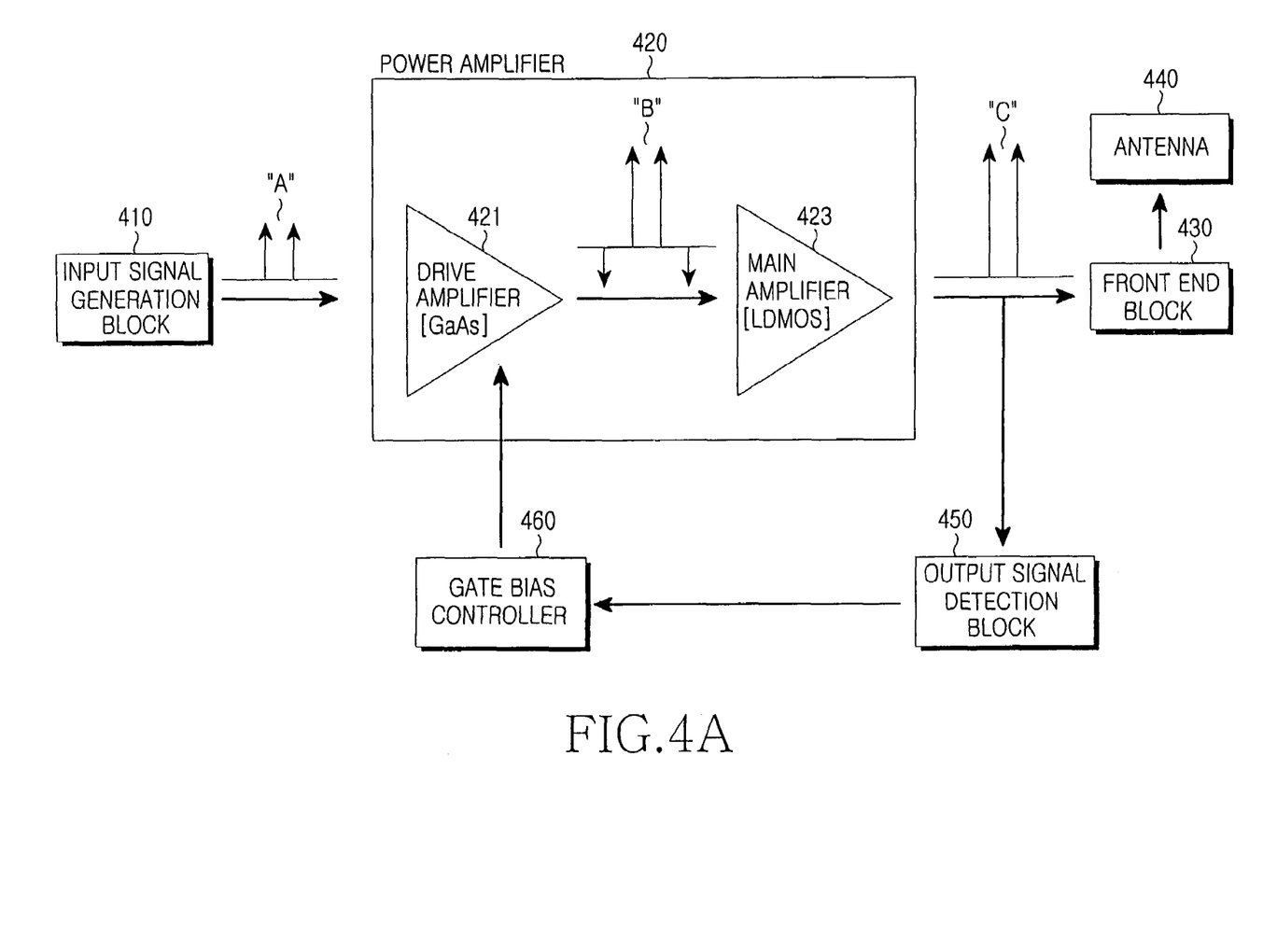
FIGS. 4A and 4B are block diagrams that illustrate another embodiment of a structure of a power amplifier using an analog pre-distorter.
Figure 4B:
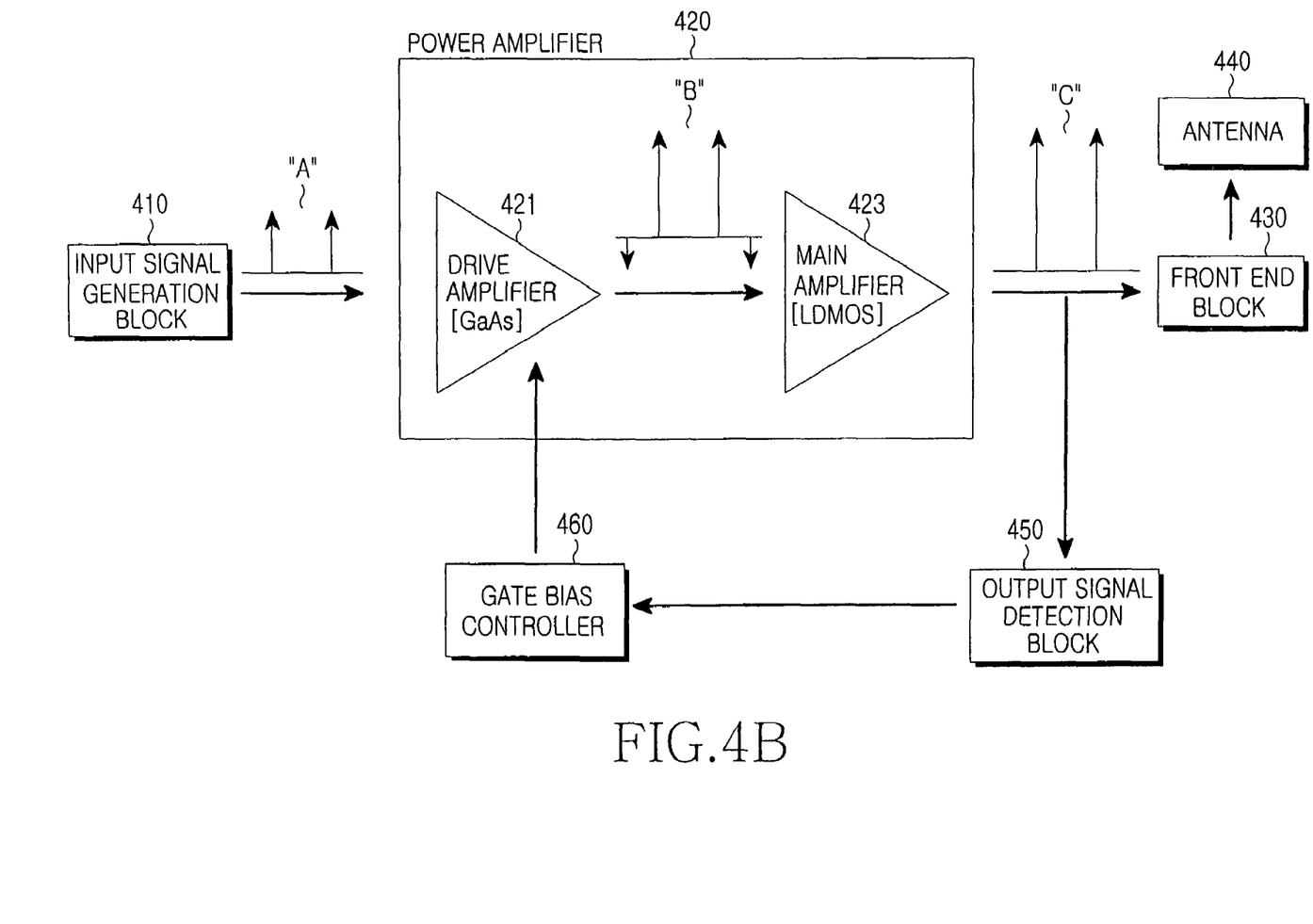

FIGS. 4A and 4B are block diagrams illustrating a power amplification system using an analog pre-distorter according to another embodiment of the present invention, which operates as an SCPA or MCPA according to an input signal. Specifically, FIG. 4A illustrates distortion components when the power amplifier operates as an SCPA in a system using a single antenna, and FIG. 4B illustrates distortion components when the power amplifier operates as an MCPA in a system using a smart antenna.

Referring to FIGS. 4A and 4B, the power amplification system includes an input signal generation block 410, a power amplifier 420, a front end block 430, an antenna 440, an output signal detection block 450, and a gate bias controller 460. The power amplifier 420 includes a drive amplifier 421 using a GaAs FET and a main amplifier 423 using an LDMOS transistor.

The power amplifier shown in FIGS. 4A and 4B uses a GaAs FET pre-distorter which operates as an SCPA or MCPA. In the GaAs FET pre-distorter, a GaAs FET of the drive amplifier 421 generates IMD components, which have the same amplitude as that of the IMD components at a main stage (that is, the main amplifier 423) of the power amplifier 420 and an opposite phase (inverse phase) to that of the IMD components at the main stage, thereby eliminating the IMD components in the signal having passed through the main amplifier 423. As a result, only the main signals are output at the final output stage, because the distortion of the main signals has been compensated, that is, the distortion components at the main amplifier 423 have been synthesized and offset by inverse phase components generated by the drive amplifier 421.

The input signal generation block 410 generates two different frequency signals, that is, input frequency signals as designated by reference symbol "A," and then outputs the generated signals A to the power amplifier 420. The power amplifier 420 receives signals A and outputs signals "C." Then, the output signal detection block 450 detects the signals C output from the power amplifier 420. Specifically, the output signal detection block 450 detects the power level of the signals C and transfers the detected value to the gate bias controller 460. Then, the gate bias controller 460 controls the gate bias of the GaAs FET within the drive amplifier 421 by using the value detected by the output signal detection block 450.

Specifically, the gate bias controller 460 controls the gate bias of the GaAs FET in accordance with the output power level detected by the output signal detection block 450. When the detected output power level exceeds a predetermined threshold, the output signal detection block 450 determines that the amplified signal includes a single carrier. In contrast, when the detected output power level does not exceed a predetermined threshold, the output signal detection block 450 determines that the amplified signal includes a multi-carrier. For another example, the output signal detection block 450 may receive carrier information from the system and use the information in the determination. When the detected output power level exceeds the predetermined threshold and the amplified signal includes a single carrier, the gate bias of the GaAs FET is controlled to operate in the class B region, thereby increasing the pre-distortion components of signals B, as shown in FIG. 4A. Further, when the detected output power level does not exceed the predetermined threshold and the amplified signal includes a multi-carrier, the gate bias of the GaAs FET is controlled to operate in the class A region, thereby eliminating the pre-distortion components of signals B, as shown in FIG. 4B.

As a result, it is possible to adaptively control the amplitude of pre-distortion components by controlling the drive stage, that is, the operation of the drive amplifier, in accordance with the detected power level of the input signal as described above. Therefore, the present invention can adaptively deal with system conditions and improve the performance of the system.

As described above, the present invention distinguishes between an input or output signal of a power amplifier that includes a single carrier with high power and also distinguishes an input or output signal of the power amplifier that includes a multi-carrier with low power. For each such case of single carrier and multi-carrier, a detector according to the present invention detects a gate bias of a GaAs FET, which has the same amplitude as that of the IMD component of an LDMOS transistor at a main stage and an opposite phase to that of the IMD component.

Further, a predetermined detection block determines if an input signal includes a single carrier or a multi-carrier, and a predetermined control block applies a gate bias corresponding to the determined carrier to a GaAs FET, thereby improving linearity of the power amplifier for both of the single carrier and the multi-carrier. It is recognized that the control block either automatically controls the bias according to the detected value or manually control the bias according to an input signal.

According to the present invention as described above, a power level of an input signal or output signal is first detected, and a gate bias of a GaAs FET is differently controlled in accordance with the detected level which may correspond to a single carrier with a high power or a multi-carrier with a low power. By using a GaAs FET analog pre-distorter which can use both the single carrier and the multi-carrier, it is possible to implement a single power amplifier which can serve as both an SCPA and an MCPA applicable to a smart antenna system without replacement of the power amplifier.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for amplifying power in a communication system, comprising steps of:
   detecting a power level of a predetermined signal selected from among an input signal and an output signal;
   adaptively changing a gate bias in accordance with the detected power level;
   generating a pre-distortion component through operation of a single carrier mode or a multi-carrier mode in accordance with the changed gate bias; and
   outputting only the predetermined signal after offsetting a distortion component generated during amplification of the predetermined signal by synthesizing the pre-distortion component with the distortion component.

2. The method as claimed in claim 1, wherein the predetermined signal is determined to be a single carrier signal when the detected level exceeds a threshold and to be a multi-carrier signal when the detected level does not exceed the threshold.

3. The method as claimed in claim 2, further comprising, when the predetermined signal is a single carrier signal, changing a class of the power amplifier to class B through control of the gate bias of the power amplifier, and generating and outputting a pre-distortion component corresponding to class B.

4. The method as claimed in claim 2, further comprising, when the predetermined signal is a multi-carrier signal, changing a class of the power amplifier to class A through control of the gate bias of the power amplifier, and generating and outputting a pre-distortion component corresponding to class A.

5. An apparatus for amplifying power in a communication system, comprising:
   a detection module which detects a power level of a predetermined signal selected from among an input signal and an output signal of a power amplifier and then transmits an operation mode control signal for the power amplifier;
   a gate bias controller which controls a gate bias of the power amplifier in accordance with the detected power level; and
   a power amplifier which operates in a class B region or a class A region in accordance with control by the gate bias controller to generate a pre-distortion component, offsets a distortion component generated during amplification of the predetermined signal by synthesizing the pre-distortion component with the distortion component, and outputs only the predetermined signal without distortion component.

6. The apparatus as claimed in claim 5, wherein the detection module comprises an input signal detector for detecting the input signal input to the power amplifier.

7. The apparatus as claimed in claim 5, wherein the detection module comprises an output signal detector for detecting the output signal output from the power amplifier.

8. The apparatus as claimed in claim 5, wherein the detection module determines if the predetermined signal is a single carrier signal with a high power or a multi-carrier signal of a low power.

9. The apparatus as claimed in claim 5, wherein, when the predetermined signal is a single carrier signal with a high power, the gate bias controller controls the gate bias of the power amplifier, so as to cause the power amplifier to operate in the class B region.

10. The apparatus as claimed in claim 5, wherein, when the predetermined signal is a multi-carrier signal with a low power, the gate bias controller controls the gate bias of the power amplifier, so as to cause the power amplifier to operate in the class A region.

11. The apparatus as claimed in claim 5, wherein the power amplifier comprises a drive amplifier using a Gallium Arsenic Field Effect Transistor (GaAs FET) and a main amplifier using a Laterally Diffused Metal Oxide Semiconductor (LDMOS) transistor.

12. The apparatus as claimed in claim 11, wherein the drive amplifier operates as a single carrier power amplifier according to a gate bias of the GaAs FET.

13. The apparatus as claimed in claim 11, wherein the drive amplifier operates as a multi-carrier power amplifier according to a gate bias of the GaAs FET.

* * * * *

UNITED STATES PATENT AND TRADEMARK OFFICE
CERTIFICATE OF CORRECTION

PATENT NO. : 7,590,394 B2  Page 1 of 1
APPLICATION NO. : 11/500255
DATED : September 15, 2009
INVENTOR(S) : Choi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 621 days.

Signed and Sealed this

Twenty-first Day of September, 2010

David J. Kappos
*Director of the United States Patent and Trademark Office*